United States Patent
Griffin

(10) Patent No.: US 9,046,564 B1
(45) Date of Patent: Jun. 2, 2015

(54) CIRCUIT TESTING DEVICE

(76) Inventor: Joseph Alan Griffin, Detroit Lakes, MN (US)

(*) Notice: Subject to any disclaimer, the term of this patent is extended or adjusted under 35 U.S.C. 154(b) by 345 days.

(21) Appl. No.: 13/568,272

(22) Filed: Aug. 7, 2012

(51) Int. Cl.
*G01R 31/20* (2006.01)

(52) U.S. Cl.
CPC .................................. *G01R 31/20* (2013.01)

(58) Field of Classification Search
CPC ................................................... G01R 31/20
USPC ............... 324/754.01–754.03, 500, 537, 555, 324/133, 503, 402, 556, 72.5; 340/660–664
See application file for complete search history.

(56) References Cited

U.S. PATENT DOCUMENTS

| | | | |
|---|---|---|---|
| 3,490,041 A | 1/1970 | Shapiro | |
| 3,829,763 A | 8/1974 | Morin | |
| 3,997,831 A | 12/1976 | Hopfner | |
| 4,445,084 A | 4/1984 | Washington | |
| 4,540,940 A | 9/1985 | Nolan | |
| 4,580,188 A * | 4/1986 | Brown et al. | 361/212 |
| 4,884,033 A * | 11/1989 | McConchie Sr. | 324/503 |
| 4,999,574 A | 3/1991 | Stephens | |
| 5,086,277 A | 2/1992 | Hammerly | |
| 5,196,798 A | 3/1993 | Baeza | |
| 5,367,250 A | 11/1994 | Whisenand | |
| 5,604,436 A * | 2/1997 | Henritzy et al. | 324/414 |
| 5,672,964 A * | 9/1997 | Vinci | 324/72.5 |
| 5,990,788 A | 11/1999 | Syracuse | |
| 6,072,317 A | 6/2000 | Mackenzie | |
| 6,977,493 B2 * | 12/2005 | Novak et al. | 324/72.5 |
| 7,184,899 B2 * | 2/2007 | Cruz | 702/57 |
| 2003/0151418 A1 * | 8/2003 | Leger | 324/715 |
| 2005/0057243 A1 * | 3/2005 | Johnson et al. | 324/158.1 |
| 2005/0200346 A1 * | 9/2005 | Novak et al. | 324/72.5 |
| 2006/0061367 A1 * | 3/2006 | Chenn | 324/503 |
| 2006/0232280 A1 * | 10/2006 | Chen et al. | 324/556 |
| 2008/0111555 A1 | 5/2008 | Rainys | |
| 2011/0080110 A1 * | 4/2011 | Nuhfer et al. | 315/291 |

OTHER PUBLICATIONS

Power Probe, www.expeditionexchange.com/powerprobe, May 9, 2006, p. 1-29.*
"Auto-Electrician's Power Test Probe", www.crypton.co.za/CDE/automotive-power-test-probe.html, Oct. 23, 2012, p. 1-3.*

* cited by examiner

*Primary Examiner* — Patrick Assouad
*Assistant Examiner* — Lamarr Brown
(74) *Attorney, Agent, or Firm* — Neustel Law Offices

(57) ABSTRACT

A circuit testing device for providing a number of features to assist in testing electrical circuits in a vehicle. The circuit testing device generally includes a housing having a plurality of testing components positioned thereon and therein. The housing generally includes a light source such as an LED for assisting in illuminating dark spaces. The housing also includes a probe for closing connections and an incandescent bulb for testing purposes. A polarity switch is provided to quickly and easily reverse polarity of the probe. A circuit breaker and circuit activation switch are also provided. By utilizing the present invention, circuit integrity as well as electrical testing of various components (both high voltage and low voltage) of a vehicle may be efficiently performed.

15 Claims, 3 Drawing Sheets

CIRCUIT TESTING DEVICE

CROSS REFERENCE TO RELATED APPLICATIONS

Not applicable to this application.

STATEMENT REGARDING FEDERALLY SPONSORED RESEARCH OR DEVELOPMENT

Not applicable to this application.

BACKGROUND OF THE INVENTION

1. Field of the Invention

The present invention relates generally to a circuit tester and more specifically it relates to a circuit testing device for providing a number of features to assist in testing electrical circuits in a vehicle.

2. Description of the Related Art

Any discussion of the related art throughout the specification should in no way be considered as an admission that such related art is widely known or forms part of common general knowledge in the field.

Circuit testing devices and systems for testing electrical circuits within a vehicle have been in use for many decades. Computer systems were first introduced into the automotive industry around the early 1980's. Tools used by repair technicians were adapted to work with new low voltage and low current carrying circuits present in such vehicles. A digital volt/ohmmeter was often needed because of its ability not to load sensitive sensor circuits for the purpose of accurate voltage measurements. Other testing devices followed which were marketed as "computer safe", such as LED-type test lights such as logic probes.

These "computer safe" devices typically demand very little current flow to operate, yet are commonly being used by technicians to diagnose circuits which are fused at 10 amps or higher. Even vehicles with computerized systems still include electrical circuits made up of 12 volt high current flowing circuits. Thus, a tool is needed for accurately diagnosing such circuits.

Because of the inherent problems with the related art, there is a need for a new and improved circuit testing device for providing a number of features to assist in testing electrical circuits in a vehicle.

BRIEF SUMMARY OF THE INVENTION

The invention generally relates to a circuit testing system which includes a housing having a plurality of testing components positioned thereon and therein. The housing generally includes a light source such as an LED for assisting in illuminating dark spaces. The housing also includes a probe for closing connections and an incandescent bulb for testing purposes. A polarity switch is provided to quickly and easily reverse polarity of the probe. A circuit breaker and circuit activation switch are also provided. By utilizing the present invention, circuit integrity as well as electrical testing of various components (both high voltage and low voltage) of a vehicle may be efficiently performed.

There has thus been outlined, rather broadly, some of the features of the invention in order that the detailed description thereof may be better understood, and in order that the present contribution to the art may be better appreciated. There are additional features of the invention that will be described hereinafter and that will form the subject matter of the claims appended hereto. In this respect, before explaining at least one embodiment of the invention in detail, it is to be understood that the invention is not limited in its application to the details of construction or to the arrangements of the components set forth in the following description or illustrated in the drawings. The invention is capable of other embodiments and of being practiced and carried out in various ways. Also, it is to be understood that the phraseology and terminology employed herein are for the purpose of the description and should not be regarded as limiting.

BRIEF DESCRIPTION OF THE DRAWINGS

Various other objects, features and attendant advantages of the present invention will become fully appreciated as the same becomes better understood when considered in conjunction with the accompanying drawings, in which like reference characters designate the same or similar parts throughout the several views, and wherein.

DETAILED DESCRIPTION OF THE INVENTION

A. Overview

Figure 1:
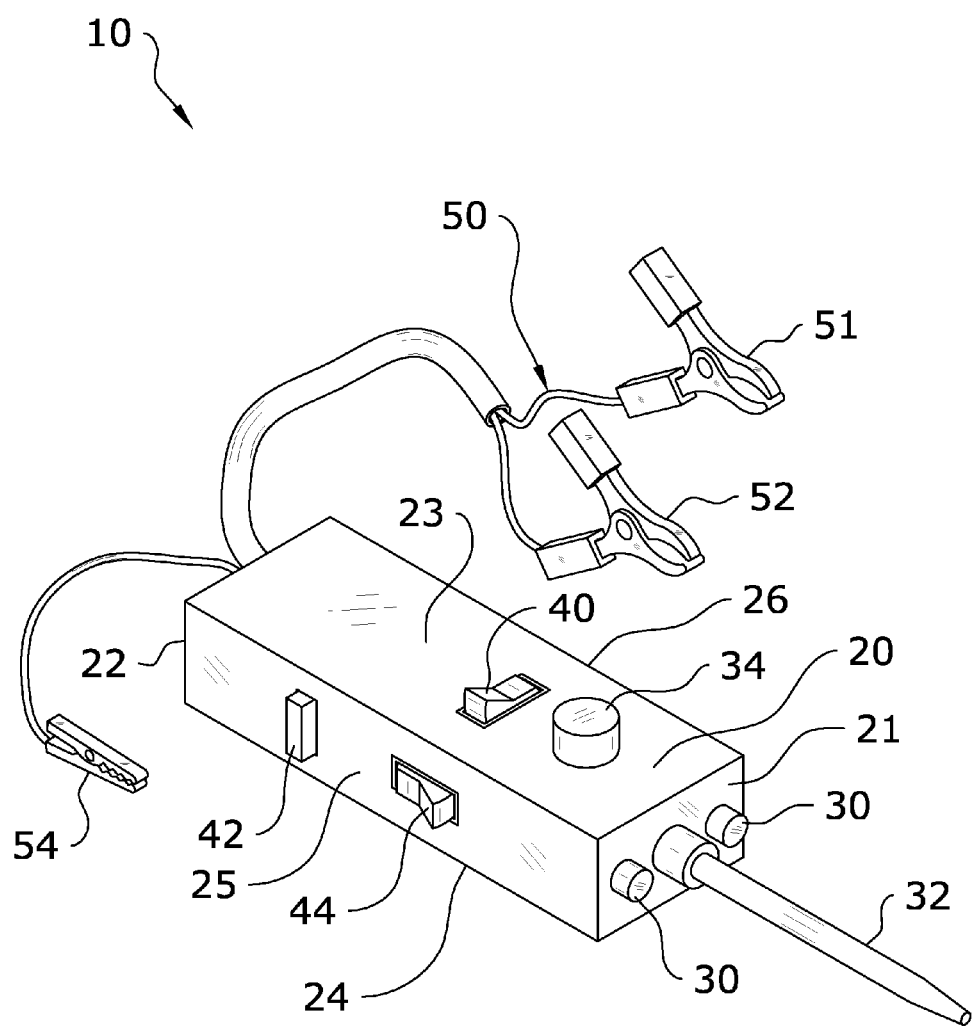
FIG. 1 is an upper perspective view of a first embodiment of the present invention.
Figure 2:
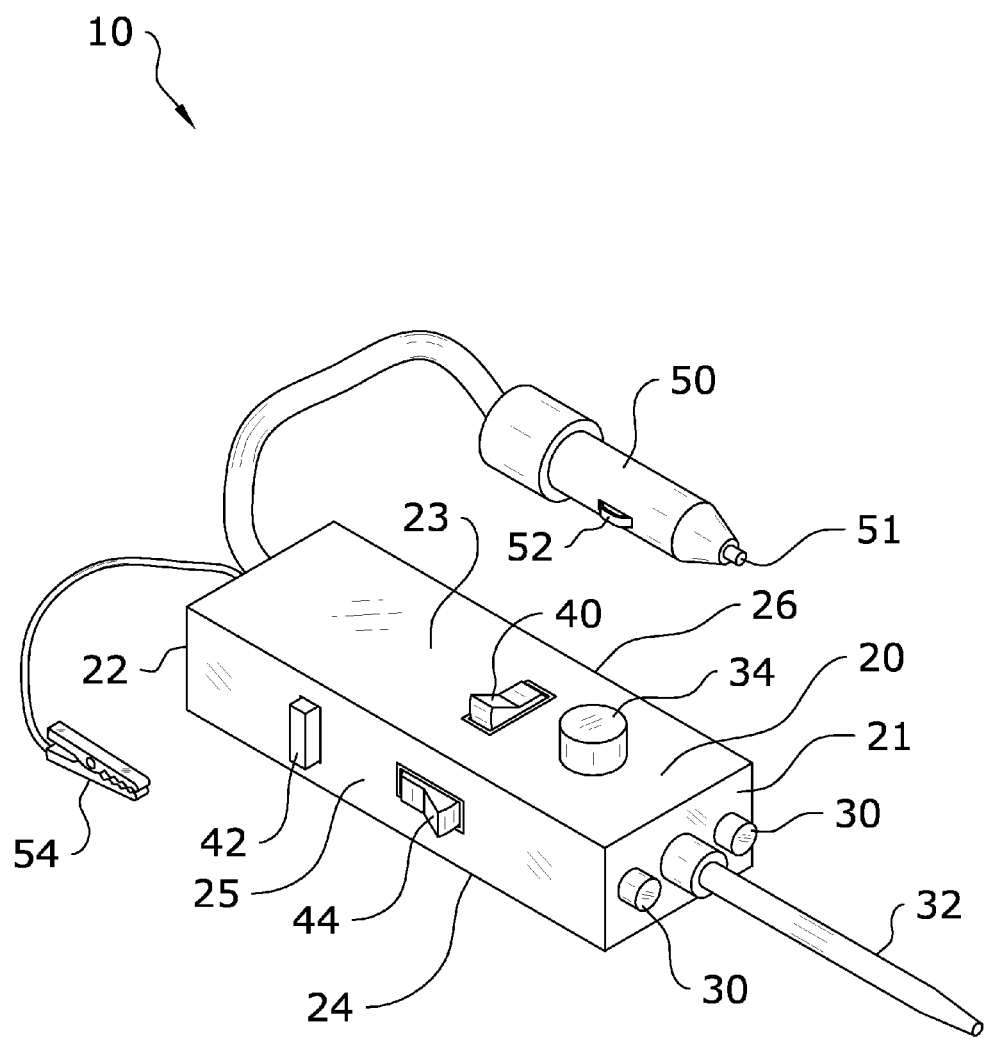
FIG. 2 is an upper perspective view of a second embodiment of the present invention.
Figure 3:
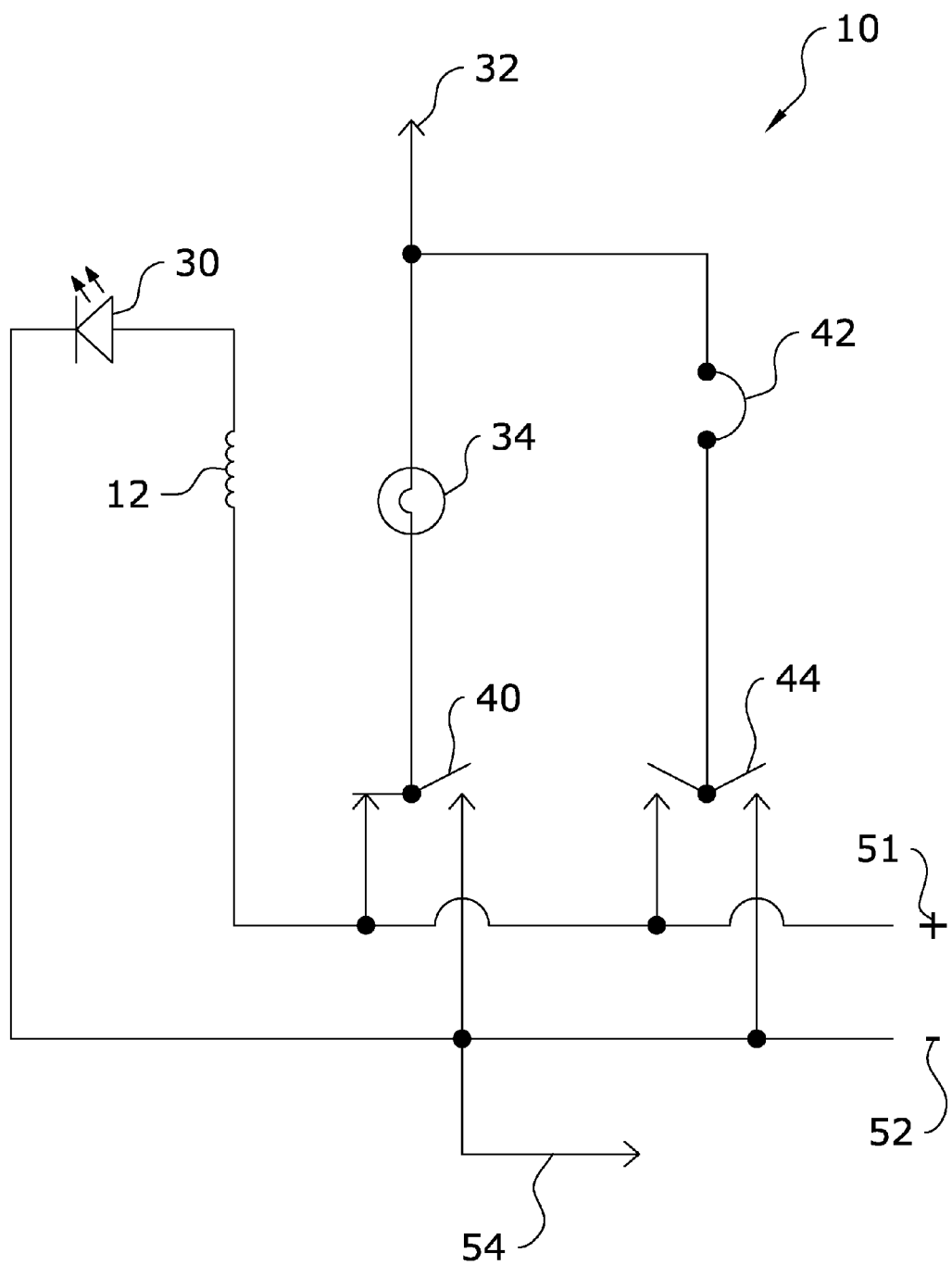
FIG. 3 is a circuit diagram illustrating the internal electrical components and connections of an exemplary embodiment of the present invention.

Turning now descriptively to the drawings, in which similar reference characters denote similar elements throughout the several views, FIGS. 1 through 3 illustrate a circuit testing device 10, which comprises a housing 20 having a plurality of testing components positioned thereon and therein. The housing 20 generally includes a light source 30 such as an LED for assisting in illuminating dark spaces. The housing 20 also includes a probe 32 for closing connections and an incandescent bulb 34 for testing purposes. A polarity switch 40 is provided to quickly and easily reverse polarity of the probe 32. A circuit breaker 42 and circuit activation switch 44 are also provided. By utilizing the present invention, circuit integrity as well as electrical testing of various components (both high voltage and low voltage) of a vehicle may be efficiently performed.

B. Housing

As shown in FIGS. 1 and 2, the various components of the present invention are generally stored in and controlled via a central housing 20. The housing 20 will generally be comprised of a hand-held device having a front end 21, a rear end 22, an upper end 23, a lower end 24, a first side 25 and a second side 26.

While the figures illustrate a housing 20 which is comprised of a substantially rectangular shape, it is appreciated that various other shapes and configurations may be utilized for the present invention in different embodiments. Thus, the scope of the present invention should not be construed as being limited by the exemplary shape and configuration shown in the figures.

FIG. 3 illustrates an exemplary internal configuration of the components of the present invention. It is appreciated that this is merely an exemplary configuration and thus should not be construed as limiting. For example, positioning of the resistor 12 may vary for different applications.

C. Testing Components

The present invention includes a plurality of testing components which are utilized to test various circuits and loads in an electrical system, such as that of a vehicle. As shown in FIG. 1, the present invention will preferably include one or more light sources 30 positioned thereon. In a preferred embodiment, the one or more light sources 30 will be comprised of a light-emitting-diode as shown in the figures, though it is appreciated that various other light sources 30 may be utilized.

Preferably, the light source(s) 30 will be positioned on the front end 21 of the housing 20 of the present invention. It is appreciated, however, that the light source(s) 30 may be positioned at various other locations on the body of the housing 20 of the present invention.

The light source(s) 30 are utilized to provide light while using the present invention. Often, the probe 32 of the present invention will need to be connected to components of a vehicle which are not properly illuminated by ambient light. The light source(s) 30 of the present invention provide assistance with vision in dark areas of the vehicle's circuitry, thus increasing effectiveness and reducing the chance of mistakes.

As shown in FIG. 1, the present invention generally also includes a probe 32. The probe 32 is generally comprised of a metallic conductor in the form of a rod or other elongated member extending from the front end 21 of the housing 20. It is appreciated, however, that the probe 32 may be positioned at various other locations on the housing 20. The length and material-type of the probe 32 may also vary for different applications of the present invention.

The probe 32 is utilized to close a circuit between the battery positive 51, battery negative 52 or ground lead 54 depending on the positioning of the polarity switch 40. The probe 32 may be positioned on various components of a circuit to verify their proper operation.

As shown in FIG. 1, the present invention generally also includes a test bulb 34. The test bulb 34 is electrically connected to the probe 32 as shown in FIG. 3. The test bulb 34 may be comprised of various types of bulbs, but will preferably be comprised of an incandescent bulb 34 with a predetermined required load. In a preferred embodiment, the test bulb 34 will require 250 mA of current flow to properly illuminate. The tested circuit may also be loaded with the test bulb 34 for testing purposes.

As shown in FIG. 1, the present invention also includes a polarity switch 40. The polarity switch 40 is utilized to reverse the polarity of the probe tip 32 and/or test bulb 34. The polarity switch 40 may be comprised of various switch configurations, so long as it functions to quickly and efficiently switch the polarity of the probe 32 between positive and negative. This feature greatly reduces confusion when searching for a good known ground or power when testing circuits. Preferably, the polarity switch 40 will be comprised of a single pole, double throw (SPDT) polarity switch.

As shown in FIG. 1, the present invention also includes a circuit breaker 42 and a circuit activation switch 44. The circuit breaker 42 is preferably resettable and may be comprised of different ratings for different applications. In a preferred embodiment, the circuit breaker 42 is rated for 10 amps. The circuit breaker 42 is utilized to assist with testing various components of an electrical system.

The circuit activation switch 44 is utilized to close the circuit of the present invention for testing purposes. Preferably, the circuit activation switch 44 will be comprised of a rocker switch capable of closing in one of two positions as shown in FIG. 3.

D. Battery Connector

As shown in FIGS. 1 and 2, the present invention includes a battery connector 50 for connecting the present invention to the battery of a vehicle or another power source. The battery connector 50 may be comprised of various configurations, such as banana clips as shown in FIG. 1 or a cigarette lighter attachment as shown in FIG. 2.

In either case, the battery connector 50 preferably includes a positive lead 51 and a negative lead 52. In a preferred embodiment, at least a 20 foot lead will be provided connecting the housing 20 to the battery connector 50 to allow for reaching distant spaces. The present invention also includes a ground lead 54 which is utilized for various tests performed by the present invention.

E. Operation of Preferred Embodiment

The present invention may be utilized for various testing purposes. To verify a circuit's operation, the battery connector 50 would be first attached to a vehicle's battery. When so attached, the light source 30 will illuminate. The operator of the present invention will then contact the circuit in question with the probe 32 to verify operation.

By switching the polarity switch 40, an operator may verify that the circuit being tested has a positive potential when in contact with the probe 32. The polarity of the test bulb 34 may be reversed through use of the polarity switch 40. The use of the polarity switch 40 allows the user to easily change device polarity without having to remove a plug and reverse it as is present on prior art devices.

The test bulb 34 will change brightness as to the voltage level of the circuit being tested. The user can easily check to see if the test bulb 34 is measuring the proper voltage level by utilizing the circuit activation switch 44 to the same polarity to which the probe 32 is set and observing the test bulb 34. If the test bulb 34 gets brighter, the voltage level at the probe tip 32 is less than the source voltage. Such a test is not generally achievable with prior art devices which utilize an LED as a load due to their low voltage low current characteristics.

The present invention may also be utilized to test various components by utilizing the ground lead 54. Various types of components may be tested, such as light bulbs, motors, fuel pumps, turn signals, headlights, power windows, computer power feeds, etc. To do so, one terminal of the component to be tested is attached to the ground lead 54 and the other to the probe tip 32. Moving the rocker switch 44 allows a positive to be applied to the probe tip 32, thus energizing the component. If the component has excessive current draw, the resettable circuit breaker 42 will trip.

The present invention may also be utilized to test electrical continuity of low resistance components such as wires, switches, connections and the like. In order for a circuit to properly function, it must have a complete path electrically from the positive of the power source to the negative. An operator of the present invention may accurately test the continuity of a component that should have low electrical resistance such as a wire or switch that is not installed into a functioning circuit. With the polarity switch 40 in the proper position, the component is simply placed between the probe tip 32 and ground lead 54. Low resistance continuity would be indicated by the test lamp 34 illuminating to full brightness. Because of the low current flow of LED's, such a configuration in the prior art would often provide a false-positive or false-negative when running such tests.

Unless otherwise defined, all technical and scientific terms used herein have the same meaning as commonly understood by one of ordinary skill in the art to which this invention belongs. Although methods and materials similar to or equivalent to those described herein can be used in the practice or testing of the present invention, suitable methods and materials are described above. All publications, patent applications, patents, and other references mentioned herein are incorporated by reference in their entirety to the extent allowed by applicable law and regulations. In case of conflict, the present specification, including definitions, will control. The present invention may be embodied in other specific forms without departing from the spirit or essential attributes thereof, and it is therefore desired that the present embodiment be considered in all respects as illustrative and not restrictive. Any headings utilized within the description are for convenience only and have no legal or limiting effect.

The invention claimed is:

1. A circuit testing device, comprising:
   a housing;
   a probe extending from a front end of said housing;
   a light source positioned on said housing;
   a test bulb positioned on said housing, wherein said test bulb is adapted to illuminate if said probe detects a set current, wherein said test bulb is adapted to brighten if said probe detects a detected voltage below a load voltage, wherein said test bulb is comprised of an incandescent bulb; and
   a polarity switch electrically connected to said test bulb.

2. The circuit testing device of claim 1, wherein said set current is comprised of 250 mA.

3. The circuit testing device of claim 1, wherein said light source is comprised of a light emitting diode.

4. The circuit testing device of claim 1, further comprising a circuit breaker positioned within said housing.

5. The circuit testing device of claim 4, wherein said circuit breaker is adapted to trip at 10 amps.

6. The circuit testing device of claim 1, further comprising a circuit activation switch.

7. The circuit testing device of claim 6, wherein said circuit activation switch is comprised of a rocker switch.

8. The circuit testing device of claim 1, further comprising a battery connector including a positive lead and a negative lead.

9. The circuit testing device of claim 8, wherein said battery connector is adapted for use in combination with a vehicle cigarette lighter.

10. A circuit testing device for a vehicle, comprising:
    a housing;
    a probe extending from a front end of said housing;
    a light source positioned on said housing;
    a test bulb positioned on said housing, wherein said test bulb is adapted to illuminate if said probe detects a set current, wherein said test bulb is adapted to brighten if said probe detects a detected voltage below a load voltage, wherein said test bulb is comprised of an incandescent bulb;
    a battery connector including a positive lead and a negative lead;
    a ground lead; and
    a polarity switch electrically connected to said test bulb.

11. The circuit testing device of claim 10, wherein said set current is comprised of 250 mA.

12. The circuit testing device of claim 10, further comprising a circuit breaker positioned within said housing.

13. The circuit testing device of claim 12, wherein said circuit breaker is adapted to trip at 10 amps.

14. The circuit testing device of claim 10, further comprising a circuit activation switch.

15. The circuit testing device of claim 10, wherein said battery connector is adapted for use in combination with a vehicle cigarette lighter.

* * * * *